(12) United States Patent
Kaneko

(10) Patent No.: US 9,070,727 B2
(45) Date of Patent: Jun. 30, 2015

(54) SUBSTRATE PROCESSING SYSTEM, SUBSTRATE TRANSFER METHOD AND STORAGE MEDIUM

(71) Applicant: Tokyo Electron Limited, Tokyo (JP)

(72) Inventor: Tomohiro Kaneko, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 195 days.

(21) Appl. No.: 13/864,431

(22) Filed: Apr. 17, 2013

(65) Prior Publication Data

US 2013/0280017 A1 Oct. 24, 2013

(30) Foreign Application Priority Data

Apr. 18, 2012 (JP) ................. 2012-095017

(51) Int. Cl.
*H01L 21/677* (2006.01)
(52) U.S. Cl.
CPC ........ *H01L 21/677* (2013.01); *H01L 21/67742* (2013.01); *H01L 21/67769* (2013.01); *H01L 21/67781* (2013.01)
(58) Field of Classification Search
CPC ............ H01L 21/677; H01L 21/67781; H01L 21/67769; H01L 21/67742
USPC ..................... 414/222.01, 217, 939
See application file for complete search history.

(56) References Cited

U.S. PATENT DOCUMENTS

| 8,303,232 | B2 | 11/2012 | Ishida | |
| 8,630,733 | B2 * | 1/2014 | Itou | 700/218 |
| 2002/0187024 | A1 * | 12/2002 | Nulman | 414/217 |
| 2006/0194445 | A1 * | 8/2006 | Hayashi et al. | 438/758 |
| 2006/0245852 | A1 * | 11/2006 | Iwabuchi | 414/217 |
| 2007/0081881 | A1 * | 4/2007 | Okuno et al. | 414/217 |
| 2008/0156351 | A1 * | 7/2008 | Mitsuyoshi et al. | 134/15 |
| 2008/0199283 | A1 * | 8/2008 | Mitsuyoshi | 414/222.01 |
| 2010/0102030 | A1 * | 4/2010 | Kondoh | 216/58 |
| 2010/0129182 | A1 * | 5/2010 | Ishida | 414/222.1 |
| 2011/0206486 | A1 * | 8/2011 | Matsuyama et al. | 414/222.02 |
| 2013/0062013 | A1 * | 3/2013 | Okada et al. | 156/322 |
| 2013/0078059 | A1 * | 3/2013 | Enokida et al. | 414/222.13 |
| 2013/0209212 | A1 * | 8/2013 | Furuya et al. | 414/788.1 |
| 2013/0236838 | A1 * | 9/2013 | Matsuyama et al. | 430/325 |
| 2013/0333731 | A1 * | 12/2013 | Kato | 134/32 |
| 2014/0003890 | A1 * | 1/2014 | Goto | 414/217 |

FOREIGN PATENT DOCUMENTS

JP 2003-273058 A 9/2003

* cited by examiner

*Primary Examiner* — Kaitlin Joerger
(74) *Attorney, Agent, or Firm* — Pearne & Gordon LLP

(57) ABSTRACT

A substrate processing system 10 includes a multiple number of substrate processing units 40A and 40B having substrate processing modules 40a and 40b, respectively; substrate buffers 30a and 30b which respectively correspond to the substrate processing units 40A and 40B; and a first substrate transfer device 50 configured to take out substrates W from substrate receptacles 20 on substrate mounting tables 25 into substrate buffers 30a and 30b. When a second substrate transfer device 60b of the substrate processing unit 40B is broken down, a substrate W remaining in the substrate buffer 30b corresponding to the substrate processing unit 40B is delivered into the substrate buffer 30a corresponding to the substrate processing unit 40A by a substrate delivery device 35.

16 Claims, 5 Drawing Sheets

SUBSTRATE PROCESSING SYSTEM, SUBSTRATE TRANSFER METHOD AND STORAGE MEDIUM

CROSS-REFERENCE TO RELATED APPLICATION

This application claims the benefit of Japanese Patent Application No. 2012-095017 filed on Apr. 18, 2012, the entire disclosures of which are incorporated herein by reference.

FIELD OF THE INVENTION

The present disclosure relates to a substrate processing system for perform a process such as a liquid process by a processing liquid, a gas process by a processing gas, a cleaning process or a heating process on a substrate such as a semiconductor wafer. The present disclosure also relates to a substrate transfer method and a storage medium.

BACKGROUND OF THE INVENTION

Conventionally, there have been known various types of substrate processing systems configured to perform a process such as a liquid process by a processing liquid, a gas process by a processing gas, a cleaning process or a heating process on a substrate such as a semiconductor wafer. A substrate processing system includes a substrate mounting table configured to mount thereon a substrate receptacle which accommodates therein a multiple number of substrates; and a multiple number of substrate processing units which have the same structure and are arranged in multiple levels. Each substrate processing unit includes a multiple number of substrate processing modules configured to perform various processes on a substrate. Further, a substrate buffer configured to temporarily accommodate therein a multiple number of substrates is also provided in each substrate processing unit. Substrates are taken out of the substrate receptacle on the substrate mounting table by a first substrate transfer device and transferred into the substrate buffers of the respective substrate processing units. Then, the substrates in each substrate buffer are transferred into the respective substrate processing modules of the substrate processing units by a second substrate transfer device. Then, the substrates processed in the substrate processing modules of the substrate processing unit are returned back into the corresponding substrate buffer by the second substrate transfer device.

Patent Document 1: Japanese Patent Laid-open Publication No. 2003-273058

As stated above, each substrate processing unit includes the multiple number of substrate processing modules and the second substrate transfer device configured to transfer a substrate between the substrate processing modules and the substrate buffer. When abnormality occurs, for example, when the second substrate transfer device within any one substrate processing unit is broken down, a substrate to be processed by this substrate processing unit may be left unprocessed in the substrate buffer of the substrate processing unit for a long time until the second substrate transfer device is properly repaired.

As stated, if abnormality occurs in any one substrate processing unit, an unprocessed substrate, if any, may be left in the substrate buffer of that substrate processing unit for a long time.

BRIEF SUMMARY OF THE INVENTION

In view of the foregoing problem, illustrative embodiments provide a substrate processing system capable of continuously performing a process on a substrate by transferring the substrate remaining in a substrate buffer corresponding to one substrate processing unit into a substrate buffer corresponding to another substrate processing unit when the one substrate processing unit is broken down. The illustrative embodiments also provide a substrate transfer method and a storage medium.

In accordance with one aspect of an illustrative embodiment, there is provided a substrate processing system. The substrate processing system includes a multiple number of substrate processing units each including multiple substrate processing modules configured to perform a process on a substrate; a substrate mounting table configured to mount thereon a substrate receptacle accommodating therein substrates; substrate buffers, which respectively correspond to the substrate processing units, each being configured to temporarily accommodate therein substrates; a first substrate transfer device configured to take out substrates from the substrate receptacle on the substrate mounting table and transfer the substrates into at least one substrate buffer; a second substrate transfer device provided in each substrate processing unit and configured to transfer a substrate between the substrate buffer and the substrate processing module; and an inter-buffer delivery device configured to deliver a substrate between the substrate buffers. When one substrate processing unit is incapable of performing a process on a substrate, an unprocessed substrate within the substrate buffer corresponding to the one substrate processing unit is delivered into the substrate buffer corresponding to another substrate processing unit by the inter-buffer delivery device.

In accordance with another aspect of the illustrative embodiment, there is provided a substrate transfer method. The substrate transfer method includes mounting a substrate receptacle accommodating therein multiple substrates on a substrate mounting table; taking out substrates from the substrate receptacle on the substrate mounting table by a first substrate transfer device and transferring the substrates into a substrate buffer corresponding to one of substrate processing units each including multiple substrate processing modules; and transferring a substrate within the substrate buffer of each substrate processing unit into a substrate processing module within the substrate processing unit by a second substrate transfer device. When one substrate processing unit is incapable of performing a substrate process, an unprocessed substrate within the substrate buffer corresponding to the one substrate processing unit is delivered into the substrate buffer corresponding to another substrate processing unit by an inter-buffer delivery device.

In accordance with still another aspect of the illustrative embodiment, there is provided a computer-readable storage medium having stored thereon computer-executable instructions that, in response to execution, cause a substrate processing system to perform a substrate transfer method. The substrate transfer method includes mounting a substrate receptacle accommodating therein multiple substrates on a substrate mounting table; taking out substrates from the substrate receptacle on the substrate mounting table by a first substrate transfer device and transferring the substrates into a substrate buffer corresponding to one of substrate processing units each including multiple substrate processing modules; and transferring a substrate within the substrate buffer of each substrate processing unit into a substrate processing module within the substrate processing unit by a second substrate transfer device. When one substrate processing unit is incapable of performing a substrate process, an unprocessed substrate within the substrate buffer corresponding to the one substrate processing unit is delivered into the substrate buffer corresponding to another substrate processing unit by an inter-buffer delivery device.

In accordance with the illustrative embodiments, when one substrate processing unit is broken down and an unprocessed substrate remains in the substrate buffer of the one substrate processing unit, the unprocessed substrate is transferred into the substrate buffer of another substrate processing unit by the inter-buffer delivery device. Accordingly, the unprocessed substrate remaining in the substrate buffer can be efficiently processed by the another substrate processing unit. Thus, the substrate can be processed continuously.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
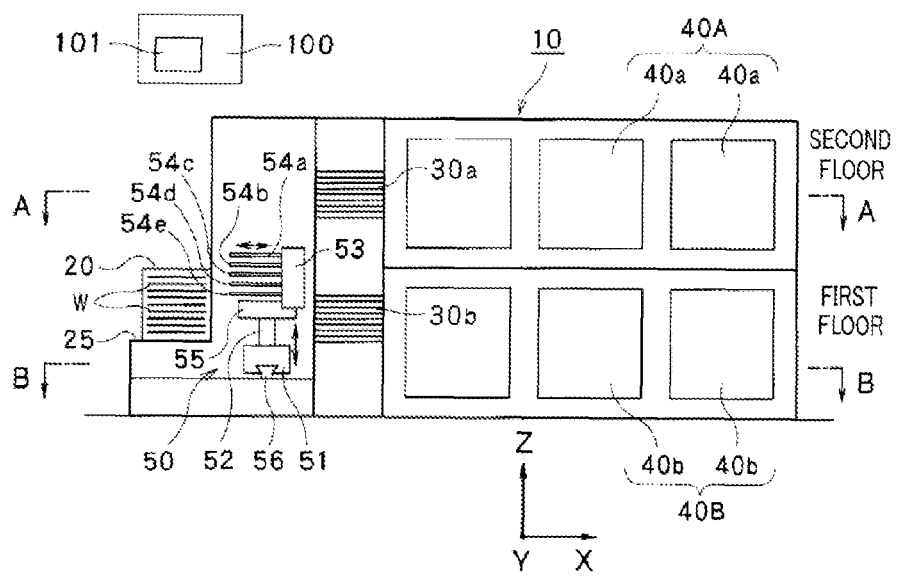
FIG. 1 is a schematic side view illustrating a configuration of a substrate processing system in accordance with an illustrative embodiment.
Figure 2:
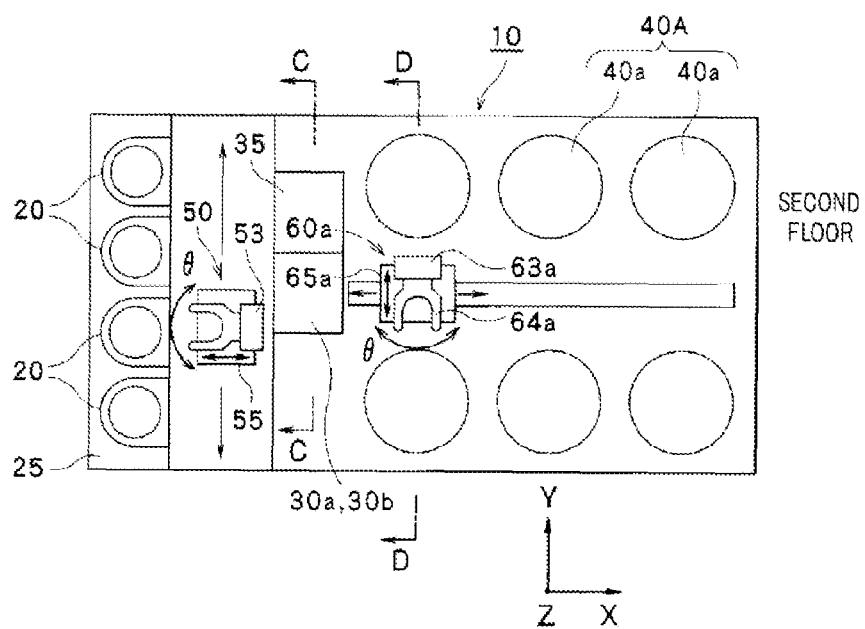
FIG. 2 is a top view of the substrate processing system of FIG. 1, taken along an A-A line arrow.
Figure 3:
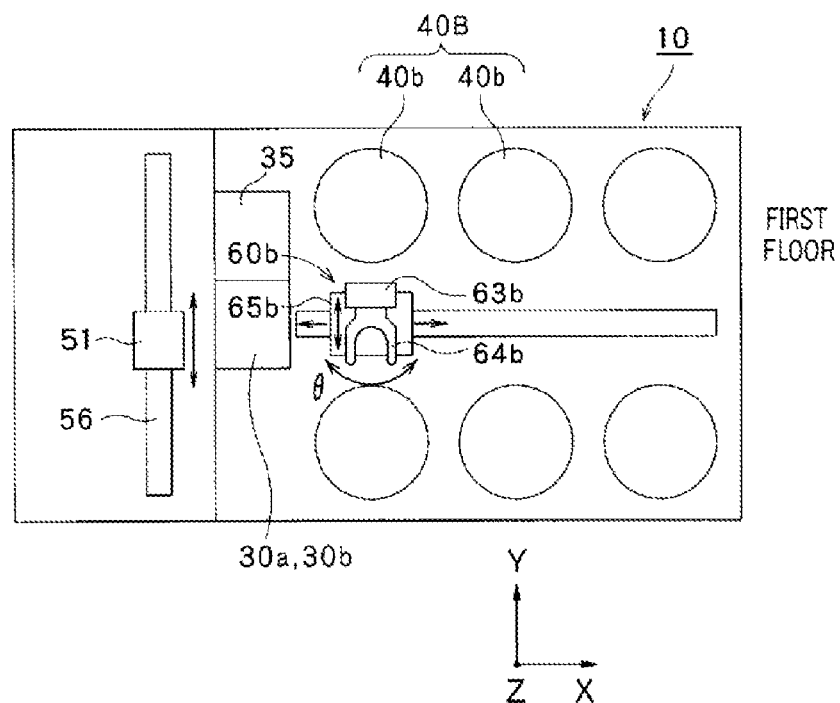
FIG. 3 is a top view of the substrate processing system of FIG. 1, taken along a B-B line arrow.
Figure 4:
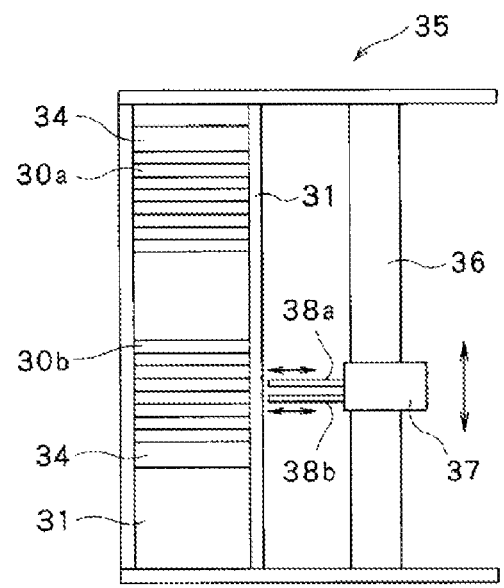
FIG. 4 is a side view of the substrate processing system of FIG. 2, taken along a C-C line arrow.
Figure 5:
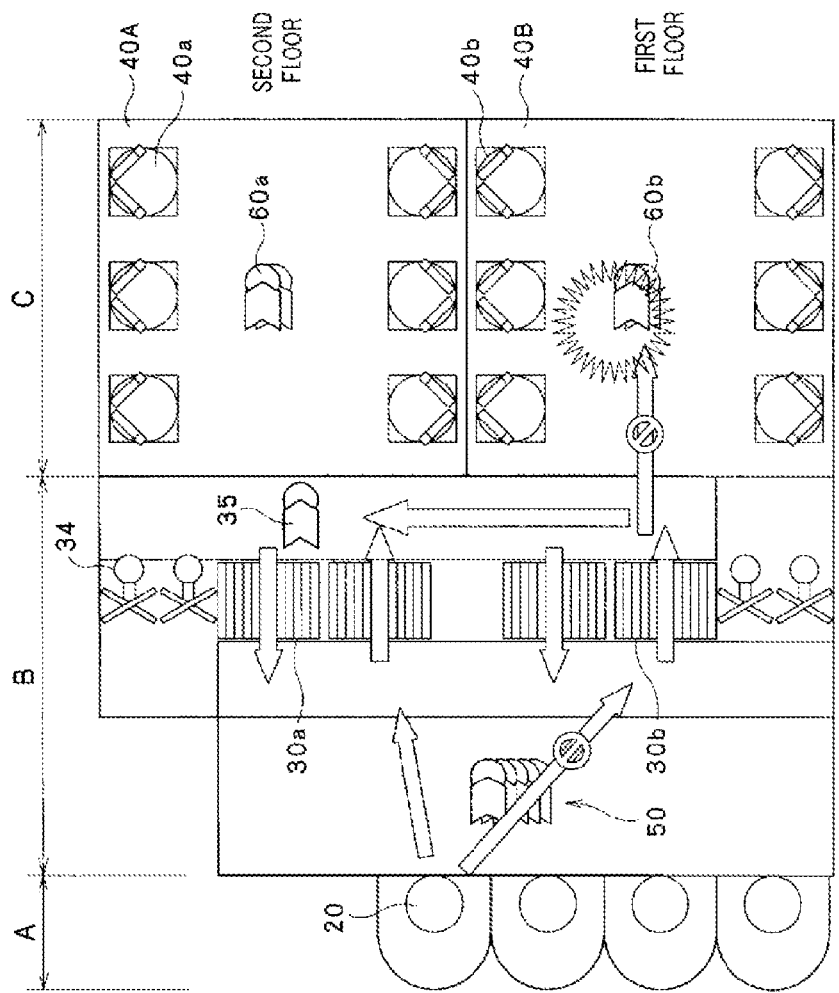
FIG. 5 is a schematic diagram illustrating an overall configuration of the substrate processing system.
Figure 6:
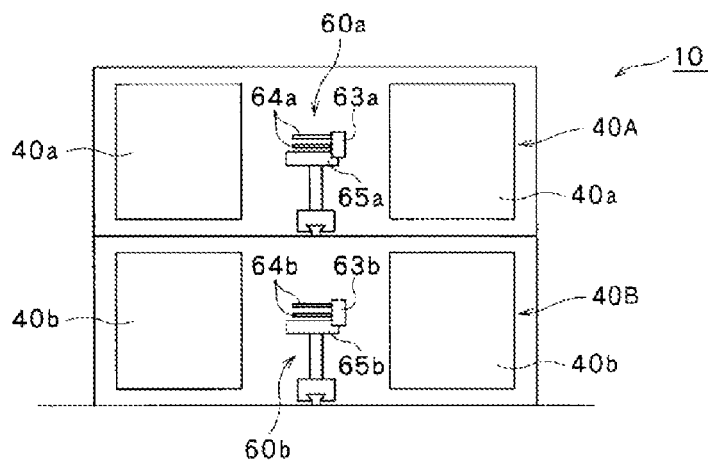
FIG. 6 is a side view of the substrate processing system of FIG. 2, taken along a D-D line arrow.
Figure 7:
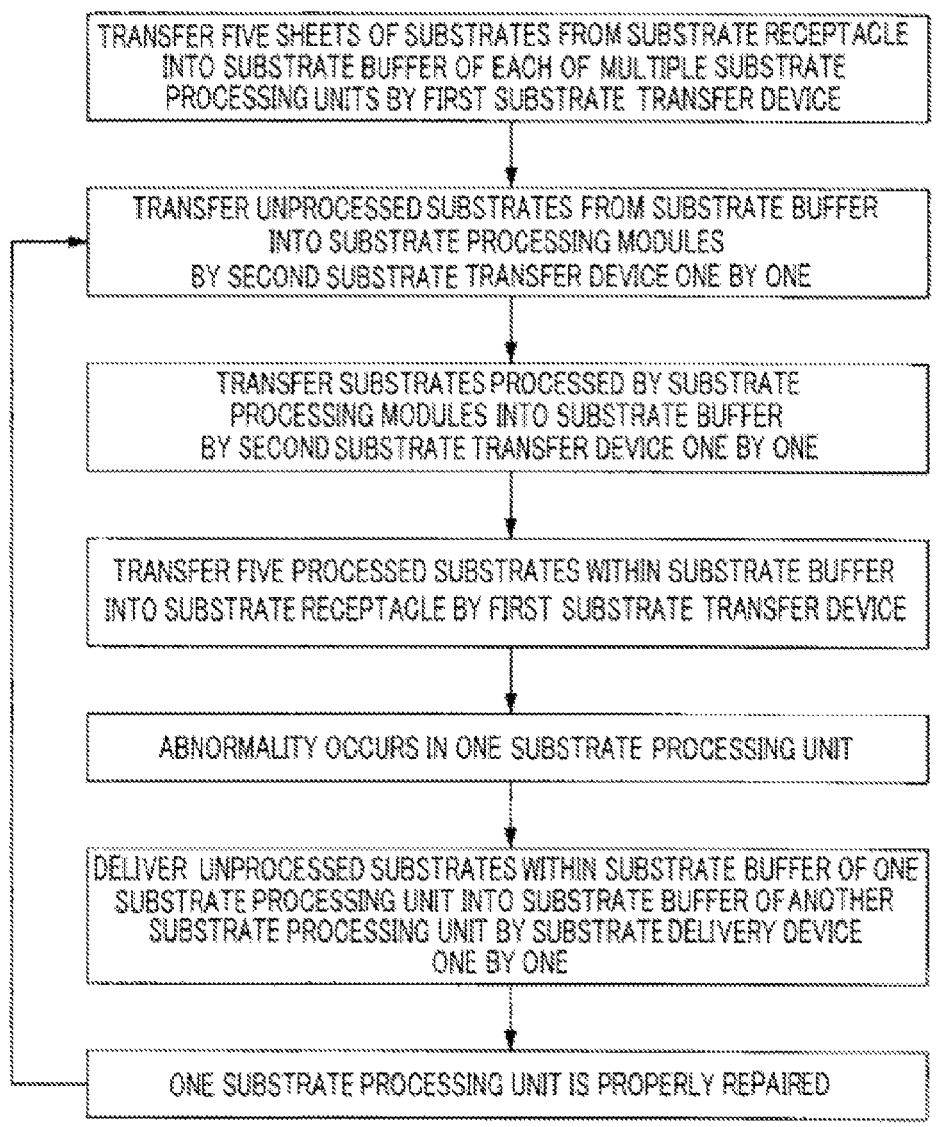
FIG. 7 is a flowchart for describing a substrate transfer method.
Figure 8:
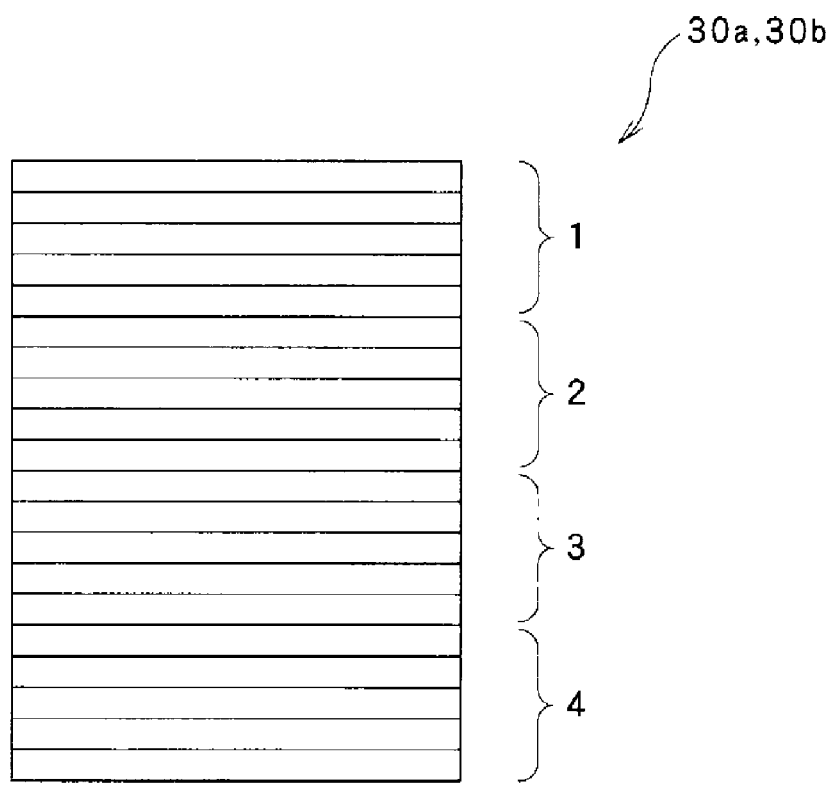
FIG. 8 is a diagram illustrating a substrate buffer provided in a substrate processing unit.

Hereinafter, an illustrative embodiment will be described with reference to the accompanying drawings. FIGS. 1 to 8 illustrate a substrate processing system, a substrate transfer method and a storage medium in accordance with the illustrative embodiment. FIG. 1 is a schematic side view illustrating a configuration of the substrate processing system in accordance with the illustrative embodiment. FIG. 2 is a top view of the substrate processing system of FIG. 1, taken along an A-A line arrow. FIG. 3 is a top view of the substrate processing system of FIG. 1, taken along a B-B line arrow. FIG. 4 is a side view of the substrate processing system of FIG. 2, taken along a C-C line arrow. FIG. 5 is a schematic diagram illustrating an overall configuration of the substrate processing system. FIG. 6 is a side view of the substrate processing system of FIG. 2, taken along a D-D line arrow. FIG. 7 is a flowchart for describing a substrate transfer method. FIG. 8 is a diagram illustrating a substrate buffer provided in a substrate processing unit.

In FIG. 5, a region A illustrates a top view of the substrate processing system and a region B illustrates a side view of the substrate processing system. In a region C, a top view illustrating the substrate processing unit on a first floor of the substrate processing system and a top view illustrating the substrate processing unit on a second floor are shown together.

As illustrated in FIGS. 1 to 4, the substrate processing system (wafer processing system) 10 of the illustrative embodiment is configured to perform a process such as a cleaning process on a semiconductor wafer (simply referred to as "wafer") W which is used as a substrate.

The substrate processing system 10 is structured in two levels, and the wafer processing system 10 includes two wafer processing units (also referred to as "substrate processing unit") 40A and 40B, which perform a cleaning process on the wafer W; a substrate mounting table 25 on which a FOUP (Front Opening Unified Pod; a wafer storage board) (also referred to as "substrate receptacle") 20 configured to accommodate a multiple number of wafers W is loaded; and substrate buffers 30a and 30b provided to correspond to the wafer processing units 40A and 40B, respectively, and configured to temporarily accommodate therein the multiple number of wafers W.

In this configuration, the wafer processing unit 40A on the second floor includes six wafer processing modules (also referred to as "substrate processing modules") 40a configured to perform a process such as a cleaning process on a wafer W. Likewise, the wafer processing unit 40B on the first floor includes six wafer processing modules 40b configured to perform the same process as that performed by the wafer processing modules 40a.

A multiple number of, e.g., five wafers W accommodated in the FOUP 20 on the substrate mounting table 25 are transferred into each of the substrate buffers 30a and 30b of the wafer processing units 40A and 40B by a first wafer transfer device (also referred to as "first substrate transfer device") 50. Further, wafers within the substrate buffers 30a and 30b respectively corresponding to the wafer processing units 40A and 40B are transferred one by one into the wafer processing modules 40a and 40b within the wafer processing units 40A and 40B by second wafer transfer devices (also referred to as "second substrate transfer device") 60a and 60b, respectively.

As mentioned above, in the wafer processing system 10, the first wafer transfer device 50 is provided between the FOUP 20 and the substrate buffers 30a and 30b. Further, as depicted in FIG. 2, FIG. 3, FIG. 6, etc., the second wafer transfer devices 60a and 60b are provided within the wafer processing units 40A and 40B of the wafer processing system 10, respectively.

Further, a wafer delivery device (also referred to as "substrate delivery device") 35 is provided adjacent to the substrate buffer 30a of the wafer processing unit 40A on the second floor and the substrate buffer 30b of the wafer processing unit 40B on the first floor to deliver a wafer W between the substrate buffers 30a and 30b. The wafer delivery device 35 is configured as an inter-buffer delivery device.

Below, each constituent component of the wafer processing system 10 will be elaborated.

As illustrated in FIGS. 1 and 2, the wafer processing system 10 includes the substrate mounting table 25 on which four FOUPs 20 are arranged side by side in a left-right direction. Each FOUP 20 accommodates therein a multiple number of, e.g., 25 sheets of wafers W. The wafers W are stacked on top of each other while distanced apart from each other in a vertical direction.

Now, the substrate buffers 30a and 30b respectively corresponding to the wafer processing units 40A and 40B and the wafer delivery device 35 disposed adjacent to the substrate buffers 30a and 30b will be explained with reference to FIG. 4. FIG. 4 is a side view of the wafer processing system 10 shown in FIG. 2, taken along a C-C line arrow.

As stated above, each of the substrate buffers 30a and 30b is configured to temporarily accommodate therein a multiple number of wafers W while allowing the wafers W to be distanced apart from each other in the vertical direction.

Here, a detailed configuration of the substrate buffers 30a and 30b will be described with reference to FIG. 4. The substrate buffers 30a and 30b have the same configuration. Each substrate buffer 30a (30b) has multiple regions, e.g., regions 1, 2, 3 and 4 (see FIG. 8).

Among the multiple regions, each of the lower two regions 3 and 4 is a place where a set of five unprocessed wafers W transferred by the first wafer transfer device 50 from the FOUP 20 is accommodated. Meanwhile, each of the upper two regions 1 and 2 is a place where a set of five processed wafers W transferred from the wafer processing modules 40a (40b) is accommodated. The wafers W within the regions 1 and 2 are returned back into the FOUP 20 by the first wafer transfer device 50.

The number of the wafers W (five sheets) accommodated in each of the regions 1, 2, 3 and 4 is identical to the number of the wafers W transferred by the first wafer transfer device 50 at one time.

As shown in FIG. 4, the substrate buffers 30a and 30b have a multiple number of vertically extending supporting members 31. To elaborate, four supporting members 31 are arranged at four corners of an imaginary square or rectangular on a horizontal plane. The substrate buffers 30a and 30b are formed between the supporting members 31. To elaborate, a multiple number of horizontally extending partition members (not shown) are provided at the supporting members 31 while arranged in the vertical direction, respectively.

With this configuration, each of the substrate buffers 30a and 30b is opened at least in left and right directions and in an upward direction in FIG. 2. Accordingly, the first wafer transfer device 50, the second wafer transfer devices 60a and 60b and the wafer delivery device 35 are allowed to access the substrate buffers 30a and 30b from different directions. That is, referring to FIG. 2, the first wafer transfer device 50 may access the substrate buffers 30a and 30b from the left direction; the second wafer transfer devices 60a and 60b may access the substrate buffers 30a and 30b from the right direction; and the wafer delivery device 35 may access the substrate buffers 30a and 30b from above. Here, if a device can access the substrate buffers 30a and 30b, it implies that the device can transfer a wafer W into the substrate buffers 30a and 30b or take out a wafer W therefrom.

Further, it may be also possible that at least two of the first wafer transfer device 50, the second wafer transfer devices 60a and 60b and the wafer delivery device 35 may access the substrate buffer 30a or 30b at the same time. Accordingly, while one device is accessing the substrate buffer 30a or 30b, another device does not need to stand by but can also access the same substrate buffer 30a or 30b. Thus, the number of wafers W that can be processed in the wafer processing system 10 per unit time can be increased.

Further, as shown in FIG. 4, wafer inverting devices 34 are provided above the substrate buffer 30a on the second floor and under the substrate buffer 30b on the first floor, respectively. Each wafer inverting device 34 is configured to invert a front surface and a rear surface of a wafer W transferred thereto by the second wafer transfer device 60a or 60b.

The wafer delivery device 35 is configured to deliver, for example, a wafer W accommodated in the substrate buffer 30b on the first floor to the substrate buffer 30a on the second floor.

As depicted in FIG. 4, the wafer delivery device 35 includes a vertically extending supporting member 36 and a fork supporting member 37 configured to be moved up and down along the supporting member 36. The fork supporting member 37 supports a pair of upper and lower forks 38a and 38b configured to mount thereon a wafer W. Each of the forks 38a and 38b is configured to hold a wafer W from a rear surface of the wafer W (i.e., from below the wafer W). Among the pair of forks 38a and 38b, the upper fork 38a is used to deliver a wafer W from the substrate buffer 30a on the second floor to the substrate buffer 30b on the first floor, and the lower fork 38b is used to deliver a wafer W from the substrate buffer 30b on the first floor to the substrate buffer 30a on the second floor. As one of the pair of forks 38a and 38b advances toward the substrate buffer 30a or 30b, this fork is capable of loading a wafer W into the substrate buffer 30a or 30b or unloading a wafer W from the substrate buffer 30a or 30b.

The second wafer transfer device 60a corresponding to the wafer processing unit 40A on the second floor is configured to transfer a wafer W between the wafer processing modules 40a of the wafer processing unit 40A and the substrate buffer 30a. Further, the second wafer transfer device 60b corresponding to the wafer processing unit 40B on the first floor is configured to transfer a wafer W between the wafer processing modules 40b of the wafer processing unit 40B and the substrate buffer 30b. Further, the first wafer transfer device 50 is configured to transfer wafers W to be processed in the wafer processing unit 40A or 40B into the substrate buffer 30a or 30b from the FOUP 20, and transfer wafers W processed by the wafer processing unit 40A or 40B into the FOUP 20 from the substrate buffer 30a or 30b.

Now, detailed configurations of the first wafer transfer device 50 and the second wafer transfer devices 60a and 60b will be described. First, the configuration of the first wafer transfer device 50 will be explained with reference to FIGS. 1 to 3.

The first wafer transfer device 50 includes a base body 51 configured to move along a rail 56 extended in a Y direction of FIG. 3; and a vertically moving member 52 provided on a top surface of the base body 51 and capable of being extended and contracted in a Z direction. A base 55 is disposed on the vertically moving member 52, and a fork supporting member 53 is provided at the base 55. A multiple number of, e.g., five forks 54a, 54b, 54c, 54d and 54e configured to mount thereon a wafer W are supported at the fork supporting member 53. Among the five forks, the topmost fork 54a is configured to be horizontally movable and can be movable independently from the other four forks 54b, 54c, 54d and 54e. The four forks 54b, 54c, 54d and 54e are configured to be horizontally movable as one body. By operating only the one fork 54a, a single sheet of a wafer W may be transferred, whereas by operating the five forks at the same time, five sheets of wafers W may be transferred concurrently.

Each of the second wafer transfer devices 60a and 60b has substantially the same configuration as the first wafer transfer device 50. To elaborate, the second wafer transfer devices 60a and 60b include bases 65a and 65b configured to be rotatable in a θ direction, respectively. Fork supporting members 63a and 63b are respectively provided at the bases 65a and 65b. The fork supporting member 63a is configured to support a pair of upper and lower forks 64a, and the fork supporting member 63b is configured to support a pair of upper and lower forks 64b (see FIG. 6).

Each of the forks 64a and 64b is configured to hold a wafer W from a rear surface thereof (i.e., from below the wafer W). Further, the forks 64a and 64b are also configured to be extendible and contractible from the fork supporting members 63a and 63b, respectively, in directions indicated by arrows in FIGS. 2 and 3.

Each wafer processing module 40a (40b) within the wafer processing unit 40A (40B) is configured to process wafers W one by one within a processing chamber. By way of example, each wafer processing module is configured to perform a process such as a liquid process by a processing liquid, a gas process by a processing gas, a cleaning process or a heating process on the wafer W while rotating the wafer W within the processing chamber.

Further, as shown in FIG. 1, the substrate processing system 10 includes a controller (control unit) 100 that controls an overall operation of the substrate processing system 10. The controller 100 controls operations of all functional components of the substrate processing system 10 (e.g., the wafer processing modules 40a and 40b, the first wafer transfer device 50, the second wafer transfer devices 60a and 60b, the wafer delivery device 35, etc.). The controller 100 may be implemented by a general-purpose computer as hardware and a program (apparatus control program, processing recipes, etc.) as software for operating the computer. The software may be stored in a storage medium such as a hard disk drive provided in the computer, or may be stored in a storage medium such as a CD-ROM, a DVD or a flash memory detachably set in the computer. Such a storage medium is indicated by a reference numeral 101 in FIG. 1. A processor 102 retreats a certain processing recipe from the storage medium 101 and executes the processing recipe based on, e.g., an instruction from a non-illustrated user interface, if necessary, so that each component of the substrate processing system 10 is operated under the control of the controller 100 and a preset process is performed.

Now, an operation of the wafer processing system 10 having the above configuration, i.e., a wafer transfer method (substrate transfer method) will be explained with reference to FIG. 7.

Typically, first, the FOUP 20 accommodating, e.g., 25 sheets of wafers W to be processed is mounted on the substrate mounting table 25. Then, a window opening/closing device of the FOUP 20 is opened, and the wafers W within the FOUP 20 are ready to be taken out. The first wafer transfer device 50 approaches the FOUP 20, and the multiple number of the forks 54a, 54b, 54c, 54d and 54e lift up wafers W within the FOUP 20 and hold thereon the wafers W. At this time, a multiple number of, e.g., five sheets of wafers W that are vertically arranged adjacent to each other may be concurrently taken out from the top in sequence by the forks 54a, 54b, 54c, 54d and 54e, respectively.

Subsequently, the first wafer transfer device 50 concurrently transfers the five sheets of wafers W taken out from the FOUP 20 into the substrate buffer 30a corresponding to the wafer processing unit 40A on the second floor. Then, the first wafer transfer device 50 takes out five sheets of wafers W from the FOUP 20 from the top in sequence and concurrently transfers the five sheets of wafers W into the substrate buffer 30b corresponding to the wafer processing unit 40B on the first floor.

Thereafter, in the wafer processing unit 40A on the second floor, the second wafer transfer device 60a approaches the substrate buffer 30a. In the pair of upper and lower forks 64a of the second wafer transfer device 60a, the lower fork 64a lifts up a single wafer W accommodated in the substrate buffer 30a and holds thereon the wafer W. While holding the wafer W on the fork 64a, the second wafer transfer device 60a approaches one wafer processing module 40a, and the wafer W held on the fork 64a is loaded into the corresponding wafer processing module 40a. Then, by way of non-limiting example, a cleaning process is performed on the wafer W within the processing chamber of the wafer processing module 40a.

Subsequently, the wafer W processed by the wafer processing module 40a is transferred back into the substrate buffer 30a from the wafer processing module 40a while being held on the upper fork 64a of the upper and lower forks 64a of the second wafer transfer device 60a.

In the meanwhile, in the wafer processing unit 40B on the first floor, the second wafer transfer device 60b approaches the substrate buffer 30b as the same manner as in the wafer processing unit 40A. In the pair of upper and lower forks 64b of the second wafer transfer device 60b, the lower fork 64b lifts up a single wafer W accommodated in the substrate buffer 30b and holds thereon the wafer W. While holding the wafer W on the fork 64b, the second wafer transfer device 60b approaches one wafer processing module 40b, and the wafer W held on the fork 64b is loaded into the corresponding wafer processing module 40b. Then, by way of non-limiting example, a cleaning process is performed on the wafer W within the processing chamber of the wafer processing module 40b.

Then, the wafer W processed by the wafer processing unit 40B is transferred back into the substrate buffer 30b from the wafer processing module 40b while being held on the upper fork 64b of the upper and lower forks 64b of the second wafer transfer device 60b.

If five sheets of processed wafers W are accommodated in the substrate buffer 30a (30b), the processed five wafers W are taken out of the substrate buffer 30a (30b) by the first wafer transfer device 50 and returned back to original positions thereof within the FOUP 20. To elaborate, the first wafer transfer device 50 accesses the substrate buffer 30a (30b), and the forks 54a, 54b, 54c, 54d and 54e of the first wafer transfer device 50 lift up the five sheets of wafers W within the substrate buffer 30a (30b) and hold thereon the wafers W, respectively. Then, the five sheets of the wafers W respectively held on the forks 54a, 54b, 54c, 54d and 54e of the first wafer transfer device 50 are moved to and mounted on original positions thereof within the FOUP 20 at the same time.

Here, if abnormality occurs in one of the wafer processing units 40A and 40B, for example, in the wafer processing unit 40B on the first floor, since the wafer processing unit 40B cannot process a wafer W, wafers W within the substrate buffer 30b corresponding to the wafer processing unit 40B may not be transferred into the wafer processing unit 40B.

As one example of the abnormality that might occur within the wafer processing unit 40B, breakdown of the second wafer transfer device 60b may be considered. Further, it can also happen that all of the six wafer processing modules 40b within the wafer processing unit 40B may become inoperable, so that it is not possible to process a wafer W in the wafer processing unit 40B. Here, all the wafer processing modules 40b may become inoperable when the wafer processing modules 40b are broken down or a power supply or a water supply thereto is all stopped.

Furthermore, at the time of checking constituent components within the wafer processing unit 40B, a wafer W cannot be loaded into the wafer processing unit 40B.

In the above-mentioned cases, wafers W may remain unprocessed within the substrate buffer 30b corresponding to the wafer processing unit 40B in which the abnormality has occurred.

In such cases, the wafers W within the substrate buffer 30b corresponding to the wafer processing unit 40B, in which the abnormality has occurred, on the first floor may be transferred into the substrate buffer 30a of the wafer processing unit 40A on the second floor by the wafer delivery device 35.

To elaborate, as depicted in FIG. 5, if there is a trouble in the second wafer transfer device 60b within, for example, the wafer processing unit 40B, unprocessed wafers W within the substrate buffer 30b cannot be loaded into the wafer processing unit 40B. Here, if, for example, two sheets of unprocessed wafers W remain in the substrate buffer 30b, the unprocessed wafers W remaining in the substrate buffer 30b may be delivered by the wafer delivery device 35 into the substrate buffer 30a corresponding to the wafer processing unit 40A on the second floor. At this time, the unprocessed wafers W may be delivered one by one.

In the meantime, processed wafers W within the substrate buffer 30b corresponding to the wafer processing unit 40B on the first floor may be immediately returned back to the original positions thereof within the FOUP 20 on the substrate mounting table 25 by the first wafer transfer device 50, even before the number of the processed wafers W accommodated in the substrate buffer 30b reaches five. For example, even when the number of the processed wafers W within the substrate buffer 30b is just three, the three wafers W are immediately returned back into the FOUP 20 without standing by until the number of processed wafers W accommodated in the substrate buffer 30b reaches five.

Then, the unprocessed wafers W delivered into the substrate buffer 30a from the substrate buffer 30b are preferentially transferred into one wafer processing module 40a by the second wafer transfer device 60a within the wafer processing unit 40A on the second floor, as stated above.

In this way, the unprocessed wafers W that have been sent into the substrate buffer 30a from the substrate buffer 30b are preferentially transferred into and processed in the wafer processing module 40a. Accordingly, the wafers W remaining in the substrate buffer 30b can be promptly processed, so that the wafers W can be processed continuously.

Then, upon the completion of a preset process on the wafers W, the wafers W are returned back into the substrate buffer 30a from the wafer processing module 40a by the second wafer transfer device 60a. Thereafter, the processed wafers W, which have been preferentially processed in the substrate buffer 30a after being delivered from the substrate buffer 30b, are returned back to the original positions thereof within the FOUP 20 on the substrate mounting table 25 by the first wafer transfer device 50 one by one.

In the aforementioned example, the three processed wafers W are returned back to the original regions thereof (regions for every five sheets of wafers W) within the FOUP 20 on the substrate mounting table 25 from the substrate buffer 30b corresponding to the wafer processing unit 40B on the first floor. That is, the preferentially processed wafers W after being delivered into the substrate buffer 30a from the substrate buffer 30b are transferred back into the FOUP 20 one by one. Accordingly, the preferentially processed wafers W can be promptly returned back to the original regions thereof within the FOUP 20.

In the meanwhile, the first wafer transfer device 50 does not transfer unprocessed wafers W within the FOUP 20 into the substrate buffer 30b of the wafer processing unit 40B on the first floor but transfers the unprocessed wafers W into the substrate buffer 30a of the wafer processing unit 40A on the second floor.

Afterward, when the wafer processing unit 40B on the first floor is ready to process a wafer W again, for example, when the second wafer transfer device 60b is repaired, the operation of delivering unprocessed wafers W remaining in the substrate buffer 30b into the substrate buffer 30a by the wafer delivery device 35 is ended. Then, the second wafer transfer device 60b returns, if any, a wafer W left in the wafer processing module 40b of the wafer processing unit 40B back into the substrate buffer 30b of the wafer processing unit 40B.

Wafers W returned into the substrate buffer 30b are then transferred back into the FOUP 20 by the first wafer transfer device 50 later. Among these wafers W, wafers W completely processed by the wafer processing unit 40B may be subjected to a subsequent process later. Meanwhile, wafers W yet to be processed by the wafer processing unit 40B may be treated as unprocessed wafers and wafers W on which a process by the wafer processing unit 40B is stopped halfway without being completely finished may be treated as incompletely processed wafers.

Afterward, wafers W within the FOUP 20 are transferred by the first wafer transfer device 50 into the substrate buffer 30b of the wafer processing unit 40B on the first floor and into the substrate buffer 30a of the wafer processing unit 40A on the second floor. Then, certain processes are performed on the wafers W within the wafer processing modules 40a and 40b of the wafer processing units 40A and 40B, respectively.

As discussed above, in accordance with the present illustrative embodiment, when a wafer W cannot be transferred into one wafer processing unit 40B due to breakdown thereof and unprocessed wafers W remain within the substrate buffer 30b corresponding to the wafer processing unit 40B, the wafers W within the substrate buffer 30b can be delivered into the substrate buffer 30a corresponding to the wafer processing unit 40A by the wafer delivery device 35.

Thus, the unprocessed wafers W can be prevented from remaining in the substrate buffer 30b of the wafer processing unit 40B for a long time and can be processed continuously.

Further, the unprocessed wafers W within the substrate buffer 30b of the wafer processing unit 40B, in which abnormality has occurred, on the first floor are delivered into the substrate buffer 30a of the wafer processing unit 40A on the second floor by the wafer delivery device 35 one by one. Thus, even though a multiple number of unprocessed wafers W are already accommodated in the substrate buffer 30a of the wafer processing unit 40A on the second floor, an inside of the substrate buffer 30a on the second floor can be prevented from being full of the wafers W, as compared to a case of delivering the wafers W all together. Thus, the wafers W can be smoothly delivered into the substrate buffer 30a on the second floor from the substrate buffer 30b on the first floor.

In the above-described illustrative embodiment, the wafer delivery device 35 is used as an inter-buffer delivery device. However, the illustrative embodiment may not be limited thereto. By way of example, the first wafer transfer device 50 may be used as an inter-buffer delivery device instead, and the unprocessed wafers W may be delivered from the substrate buffer 30b of the wafer processing unit 40B on the first floor into the substrate buffer 30a of the wafer processing unit 40A on the second floor by the first wafer transfer device 50.

Further, the illustrative embodiment has been described for the configuration where the substrate processing system 10 includes the wafer processing unit 40A arranged on the second floor and the wafer processing unit 40B arranged on the first floor. However, the illustrative embodiment may not be limited thereto. For example, the wafer processing unit 40A and the wafer processing unit 40B of the substrate processing system 10 may be arranged side by side on the same floor.

What is claimed is:
1. A substrate processing system comprising:
a plurality of substrate processing units each including multiple substrate processing modules configured to perform a process on a substrate;
a substrate mounting table configured to mount thereon a substrate receptacle accommodating therein substrates;

substrate buffers, which respectively correspond to the substrate processing units, each being configured to temporarily accommodate therein substrates;

a first substrate transfer device configured to take out substrates from the substrate receptacle on the substrate mounting table and transfer the substrates into at least one substrate buffer;

a second substrate transfer device provided in each substrate processing unit and configured to transfer a substrate between the substrate buffer and the substrate processing module; and an inter-buffer delivery device configured to deliver a substrate between the substrate buffers, wherein when one substrate processing unit is incapable of performing a process on a substrate, an unprocessed substrate within the substrate buffer corresponding to the one substrate processing unit is delivered into the substrate buffer corresponding to another substrate processing unit by the inter-buffer delivery device, and when one substrate processing unit is incapable of performing a substrate process, the first substrate transfer device is configured to transfer the substrate completely processed by the one substrate processing unit into the substrate receptacle from the substrate buffer corresponding to the one substrate processing unit, and to return substrates, which are delivered into the substrate buffer corresponding to another substrate processing unit by the inter-buffer delivery device and then completely processed by the another substrate processing unit, back into the substrate receptacle from the substrate buffer corresponding to the another substrate processing unit one by one.

2. The substrate processing system of claim 1, wherein the inter-buffer delivery device is formed of a substrate delivery device separated from the first substrate transfer device.

3. The substrate processing system of claim 1, wherein the inter-buffer delivery device is formed of the first substrate transfer device.

4. The substrate processing system of claim 1, wherein in a normal operation mode, the first substrate transfer device is configured to take out multiple substrates from the substrate receptacle at one time and return substrates back into the substrate receptacle at one time.

5. The substrate processing system of claim 1, wherein while an unprocessed substrate within one substrate processing unit is being delivered into the substrate buffer corresponding to another substrate processing unit by the inter-buffer delivery device, if the one substrate processing unit is ready to resume a substrate process, a delivery operation by the inter-buffer delivery device is ended.

6. The substrate processing system of claim 1, wherein unprocessed substrates are delivered one by one from the substrate buffer corresponding to one substrate processing unit incapable of performing a substrate process into the substrate buffer corresponding to another substrate processing unit by the inter-buffer delivery device.

7. The substrate processing system of claim 1, wherein when the second substrate transfer device of one substrate processing unit is broken down, an unprocessed substrate within the substrate buffer corresponding to the one substrate processing unit is delivered into the substrate buffer corresponding to another substrate processing unit by the inter-buffer delivery device.

8. The substrate processing system of claim 1, wherein when all of the substrate processing modules of one substrate processing unit are broken down, an unprocessed substrate within the substrate buffer corresponding to the one substrate processing unit is delivered into the substrate buffer corresponding to another substrate processing unit by the inter-buffer delivery device.

9. A substrate transfer method comprising:

mounting a substrate receptacle accommodating therein multiple substrates on a substrate mounting table;

taking out substrates from the substrate receptacle on the substrate mounting table by a first substrate transfer device and transferring the substrates into a substrate buffer corresponding to one of substrate processing units each including multiple substrate processing modules; and transferring a substrate within the substrate buffer of each substrate processing unit into a substrate processing module within the substrate processing unit by a second substrate transfer device, wherein when one substrate processing unit is incapable of performing a substrate process, an unprocessed substrate within the substrate buffer corresponding to the one substrate processing unit is delivered into the substrate buffer corresponding to another substrate processing unit by an inter-buffer delivery device, and when one substrate processing unit is incapable of performing a substrate process, the first substrate transfer device is configured to transfer the substrate completely processed by the one substrate processing unit into the substrate receptacle from the substrate buffer corresponding to the one substrate processing unit, and to return substrates, which are delivered into the substrate buffer corresponding to another substrate processing unit by the inter-buffer delivery device and then completely processed by the another substrate processing unit, back into the substrate receptacle from the substrate buffer corresponding to the another substrate processing unit one by one.

10. The substrate transfer method of claim 9, wherein the inter-buffer delivery device is formed of a substrate delivery device separated from the first substrate transfer device.

11. The substrate transfer method of claim 9, wherein the inter-buffer delivery device is formed of the first substrate transfer device.

12. The substrate transfer method of claim 9, wherein while an unprocessed substrate within one substrate processing unit is being delivered into the substrate buffer corresponding to another substrate processing unit by the inter-buffer delivery device, if the one substrate processing unit is ready to resume a substrate process, a delivery operation by the inter-buffer delivery device is ended.

13. The substrate transfer method of claim 9, wherein unprocessed substrates are delivered one by one from the substrate buffer corresponding to one substrate processing unit incapable of performing a substrate process into the substrate buffer corresponding to another substrate processing unit by the inter-buffer delivery device.

14. The substrate transfer method of claim 9, wherein when the second substrate transfer device of one substrate processing unit is broken down, an unprocessed substrate within the substrate buffer corresponding to the one substrate processing unit is delivered into the substrate buffer corresponding to another substrate processing unit by the inter-buffer delivery device.

15. The substrate transfer method of claim 9, wherein when all of the substrate processing modules of one substrate processing unit are broken down, an unprocessed substrate within the substrate buffer corresponding to the one substrate processing unit is delivered into the substrate buffer corresponding to another substrate processing unit by the inter-buffer delivery device.

16. A computer-readable storage medium having stored thereon computer-executable instructions that, in response to execution, cause a substrate processing system to perform a substrate transfer method as claimed in claim 9.

* * * * *

UNITED STATES PATENT AND TRADEMARK OFFICE
CERTIFICATE OF CORRECTION

PATENT NO. : 9,070,727 B2
APPLICATION NO. : 13/864431
DATED : June 30, 2015
INVENTOR(S) : Tomohiro Kaneko Page 1 of 1

It is certified that error appears in the above-identified patent and that said Letters Patent is hereby corrected as shown below:

In the specification,

Column 6, line 54, please replace "a e direction" with -- a $\theta$ direction --

Signed and Sealed this
Twenty-sixth Day of January, 2016

Michelle K. Lee
*Director of the United States Patent and Trademark Office*